United States Patent [19]

Huard

[11] Patent Number: 5,189,640

[45] Date of Patent: Feb. 23, 1993

[54] HIGH SPEED, MULTI-PORT MEMORY CELL UTILIZABLE IN A BICMOS MEMORY ARRAY

[75] Inventor: Jeff M. Huard, Puyallup, Wash.

[73] Assignee: National Semiconductor Corporation, Santa Clara, Calif.

[21] Appl. No.: 758,226

[22] Filed: Sep. 9, 1991

Related U.S. Application Data

[63] Continuation of Ser. No. 499,715, Mar. 27, 1990, abandoned.

[51] Int. Cl.[5] .................... G11C 11/00; G11C 11/34; G11C 8/00
[52] U.S. Cl. .................... 365/154; 365/156; 365/177; 365/179; 365/225.6; 365/230.06
[58] Field of Search .............. 365/154, 156, 177, 179, 365/155, 225.6, 230.05

[56] References Cited

U.S. PATENT DOCUMENTS

| | | | |
|---|---|---|---|
| 4,447,891 | 5/1984 | Kadota | 365/230.05 |
| 4,616,347 | 10/1986 | Bernstein | 365/230.05 |
| 4,623,970 | 11/1986 | Allen et al. | 365/230.05 |
| 4,701,883 | 10/1987 | Wrathall et al. | 365/154 |
| 4,768,172 | 8/1988 | Sasaki | 365/230.05 |
| 4,817,051 | 3/1989 | Chang | 365/230.05 |
| 4,833,648 | 5/1989 | Scharrer et al. | 365/230.05 |
| 4,933,899 | 6/1990 | Gibbs | 365/230.05 |

Primary Examiner—Joseph L. Dixon
Assistant Examiner—Michael A. Whitfield
Attorney, Agent, or Firm—Limbach & Limbach

[57] ABSTRACT

A multi-port memory cell utilizes a storage cell to define complementary data storage nodes. Each read port of the memory cell includes two FETs respectively coupled between one of a pair of complementary data-out lines and a read enable line to isolate the read ports. Each of the gates of the two read port FETs is connected to one of the corresponding data storage nodes. The storage cell is read by pulling current from the read enable line and monitoring the difference between the complementary data-out lines.

8 Claims, 6 Drawing Sheets (PRIOR ART)
FIG. 1

HIGH SPEED, MULTI-PORT MEMORY CELL UTILIZABLE IN A BICMOS MEMORY ARRAY

This is a continuation of co-pending application Ser. No. 499,715 filed on Mar. 27, 1990 now abandoned.

BACKGROUND OF THE INVENTION

1. Field of the Invention

The present invention relates to random access memory circuits and, in particular, to a small, high speed multi-port memory cell that utilizes all CMOS transistors, transfers data differentially and can be easily modified to accommodate additional ports.

2. Discussion of the Prior Art

A memory cell is an electronic circuit in which a binary digit, or bit, of information can be stored. In an integrated circuit memory device, a large number of memory cells are arranged in matrix form to provide storage capability for large volumes of binary data. In addition to the memory cell storage matrix, the memory device includes a write port for writing binary data into the memory cells and a read port for reading stored binary data from the memory cells.

It is often useful to provide a memory cell with multiple write and read ports, all independent of each other. This multi-port architecture permits simultaneous access to more than one memory cell or groups of memory cells in the storage matrix, thereby improving access to data and decreasing the time required for operations relating to that data.

Figure 1:
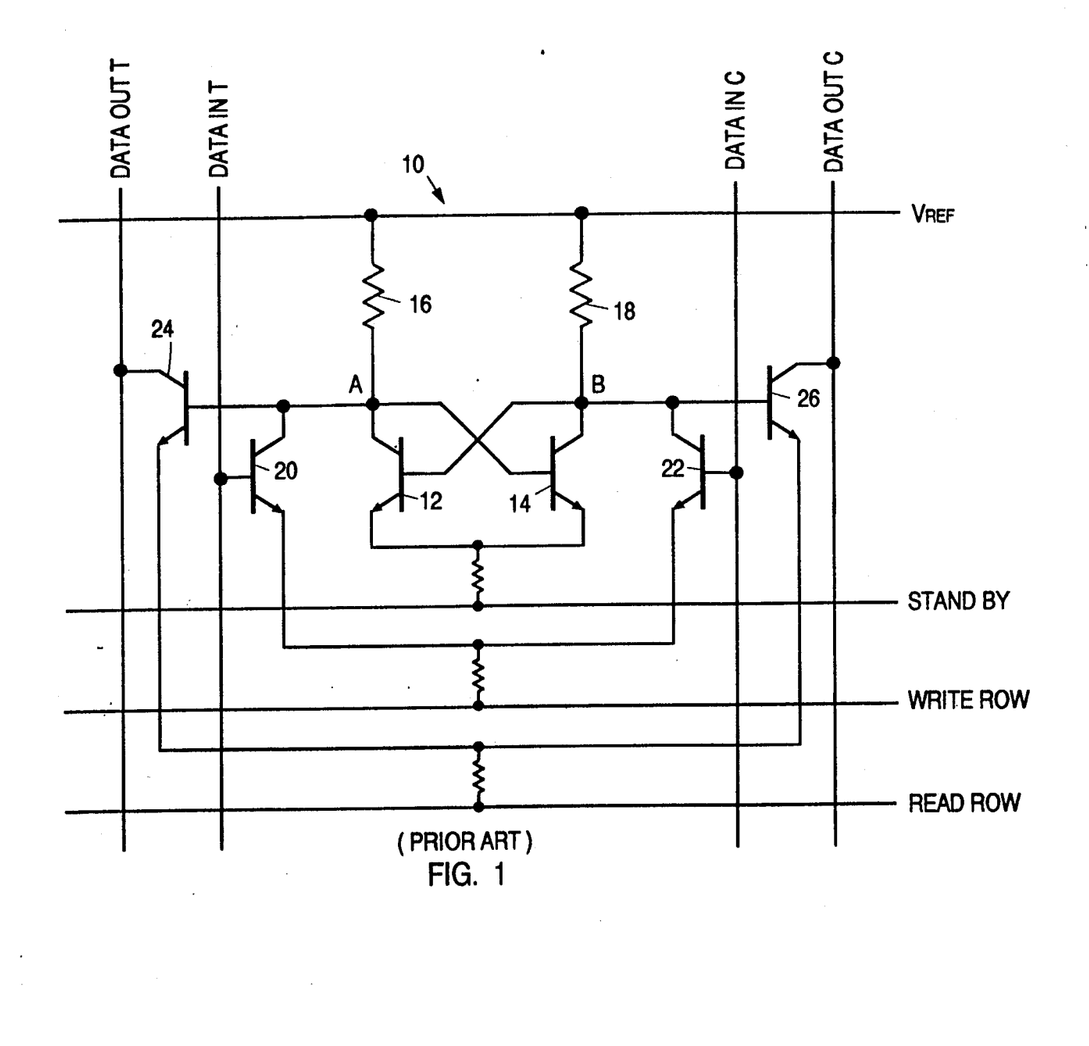
FIG. 1 is a schematic circuit diagram illustrating a prior art memory cell.

FIG. 1 shows a typical prior art multi-port memory cell 10 that is implemented with bipolar transistors in an ECL (emitter-coupled logic) circuit. NPN transistors 12 and 14 form a flip-flop that stores data, with stand-by current supplied through resistors 16 and 18 from a voltage source V$_{REF}$. Write and read operations are accomplished by steering current through differentially connected NPN transistors 20,22,24,26. During a write operation, transistors 20 and 22 are enabled by current applied to their emitter regions via the WRITE ROW line. One of the transistors 20,22 turns on, depending on the state of the complementary DATA IN lines, each of which is connected to the base of one of the transistors 20,22, and diverts the stand-by current, thus writing data to the memory cell 10. The read circuitry includes transistors 24 and 26 which form a differential cascode sensing circuit in combination with a sense amplifier (not shown) that drives the complementary DATA OUT lines and the collectors of transistors 24 and 26 to a relatively constant voltage. During a read operation, transistors 24 and 26 are enabled by current applied to their emitter regions via the READ ROW line, turning one of the transistors on, depending on the state of the memory cell storage nodes A and B. The sense amplifier senses differential current flowing through the DATA OUT lines via transistors 24 and 26.

It should be apparent to those familiar with the art that additional write ports can readily be added to memory cell 10 by adding additional WRITE lines and associated NPN transistor pairs with collectors connected to the storage nodes A and B. Similarly, additional read ports can be provided by adding READ lines and associated NPN transistor pairs with their bases connected to nodes A and B.

Although memory cell 10 is a high speed circuit due to its ECL circuitry, it requires substantial power both to retain the data in the memory cell during standby and for read and write operations. It also requires a relatively large layout area.

Figure 2:
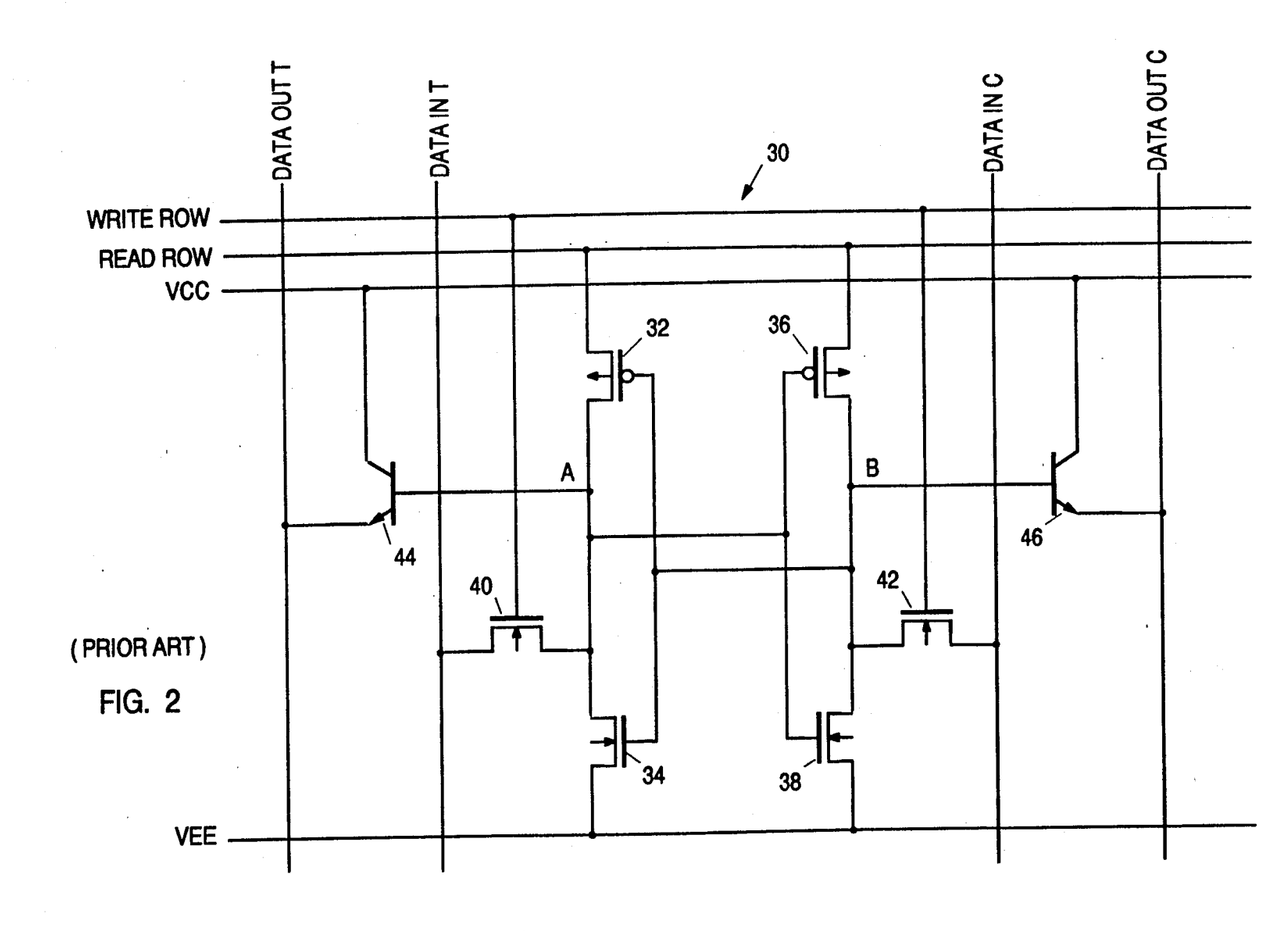
FIG. 2 is a schematic circuit diagram illustrating another prior art memory cell.

FIG. 2 shows another prior art memory cell 30 that adds two bipolar transistors 44 and 46 to a conventional, single-port, six-transistor (6T) complementary metal-oxide semiconductor (CMOS) memory cell to provide a multi-port architecture. The basic 6T CMOS memory cell includes a CMOS flip-flop formed by two cross-coupled pairs of complementary MOSFET transistors 32,34 and 36,38 that are interconnected to provide complementary data storage nodes A and B. Writing to the memory cell 30 is accomplished by enabling the WRITE ROW line, which turns on n-channel transistors 40 and 42, thereby writing the data on the complementary DATA IN lines to the storage nodes A and B. Reading from the memory cell 30 is accomplished via the two bipolar NPN transistors 44 and 46, one of which turns on, based on the state of the storage nodes A and B, to drive its corresponding DATA OUT line when the READ ROW is enabled.

In several respects, the memory cell 30 shown in FIG. 2 is an improvement over the FIG. 1 memory cell 10. Memory cell 30 reduces the amount of current required to store data because the CMOS flip-flop requires only small junction leakage current to retain its state. As with the FIG. 1 cell, additional ports can easily be added.

However, although cell 30 has a high speed read path, using inherently fast bipolar transistors to drive the DATA OUT lines, the read operation is slowed because of the large (600–800 mv) swing on the DATA OUT lines and the large READ ROW line capacitance. In addition, incorporation of the bipolar transistors increases the layout area. The use of the bipolar devices also makes for difficulty in level matching of the eight devices utilized in the design. Because the READ ROW line swings by at least 600–800 mv, the voltage across the memory cell 30 at standby is less than the full supply; this increases the possibility of data upsets because of reduced noise immunity and increased sensitivity to alpha events.

Figure 3:
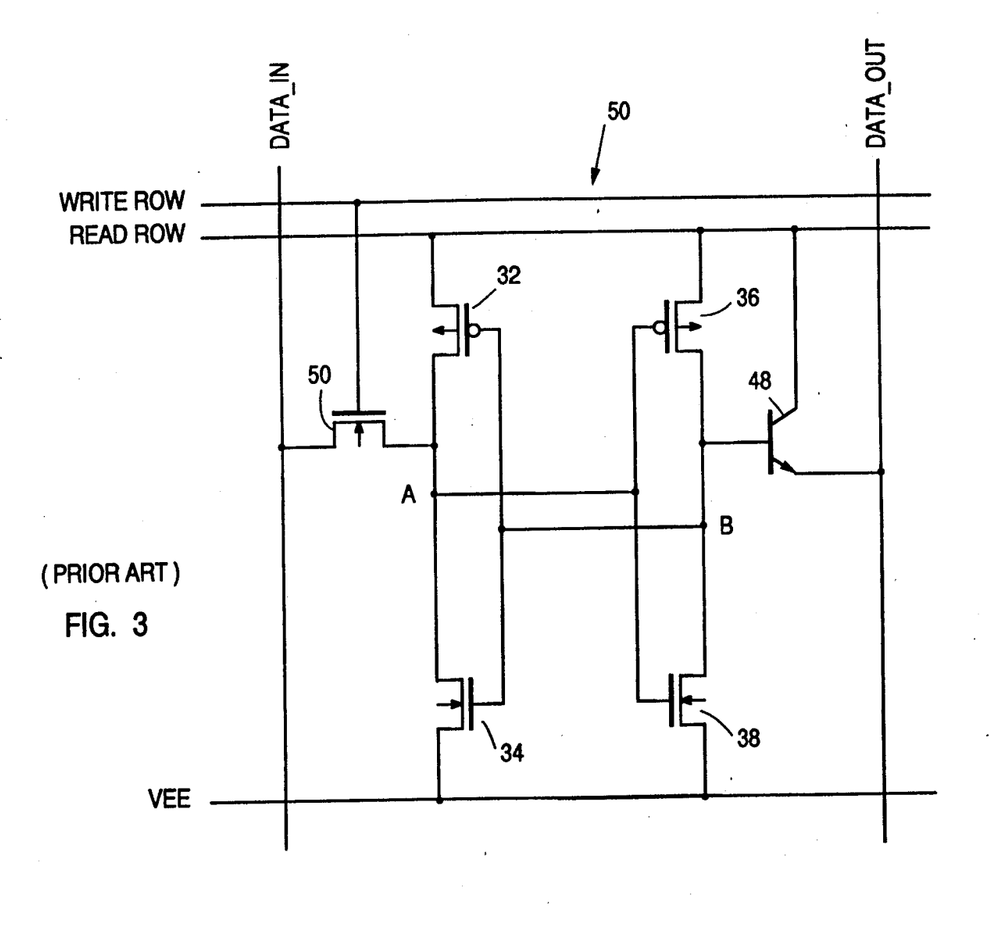
FIG. 3 is a schematic circuit diagram illustrating still another prior art memory cell.

A related memory cell 50, the so-called "Stanford cell" shown in FIG. 3, also utilizes the basic CMOS flip-flop storage cell structure (i.e., complementary transistors 32,34 and 36,38) of the FIG. 2 cell, but is single-ended via bipolar transistor 48 for read operations and via MOSFET transistor 50 for write operations. Although simpler than the FIG. 2 cell, memory cell 50 requires a reference for read operations and has poor common mode rejection of spurious signals. It also suffers from the disadvantages of difficult level matching and increased susceptibility to alpha upset due to use of the bipolar transistor 48.

SUMMARY OF THE INVENTION

The present invention provides a memory cell that utilizes CMOS transistors configured as three functional units: a storage cell, one or more write ports, and one or more read ports. According to a preferred embodiment of the invention, the storage cell includes two pairs of complementary field-effect transistors interconnected as a flip-flop in the conventional manner to provide two complementary data storage nodes. Each write port includes two field-effect transistors respectively coupled in the conventional manner between one of two complementary data-in lines and a corresponding data storage node of the flip-flop storage cell. The gates of the two write port transistors are connected to a write-enable control line to enable the write port transistors when writing data to the storage cell. In accordance with the invention, each read port includes two field-effect transistors respectively coupled between one of two complementary data-out lines and a read enable line to isolate the read and write ports. Each of the gates of the two read port transistors is connected to one of the storage nodes of the flip-flop storage cell. The storage cell is read by pulling current out of the read enable line and monitoring the difference in current between the complementary data-out lines.

In an alternative embodiment of the invention, the p-channel transistors of the flip-flop storage cell are replaced by resistors which provide stand-by current from the positive rail.

The memory cell of the present invention provides a number of advantages over the prior art. Its read path is as fast as the pure bipolar memory cell without the area and power penalty. Because the read port FETs result in a robust, well-isolated design, a read operation has a greatly reduced probability of disturbing the stored data; its additional gate capacitance also improves sensitivity to alpha particles. Unlike the standard 6T CMOS cells, precharging is not required for a read operation. The only restriction on read and write operations is that multiple writes cannot occur on the same address simultaneously. The cell utilizes differential data read and write, eliminating the requirement for reference levels and the problems associated with matching these reference levels.

In short, the present invention provides a memory cell having ECL read performance with CMOS power and area advantages.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENTS

Figure 4:
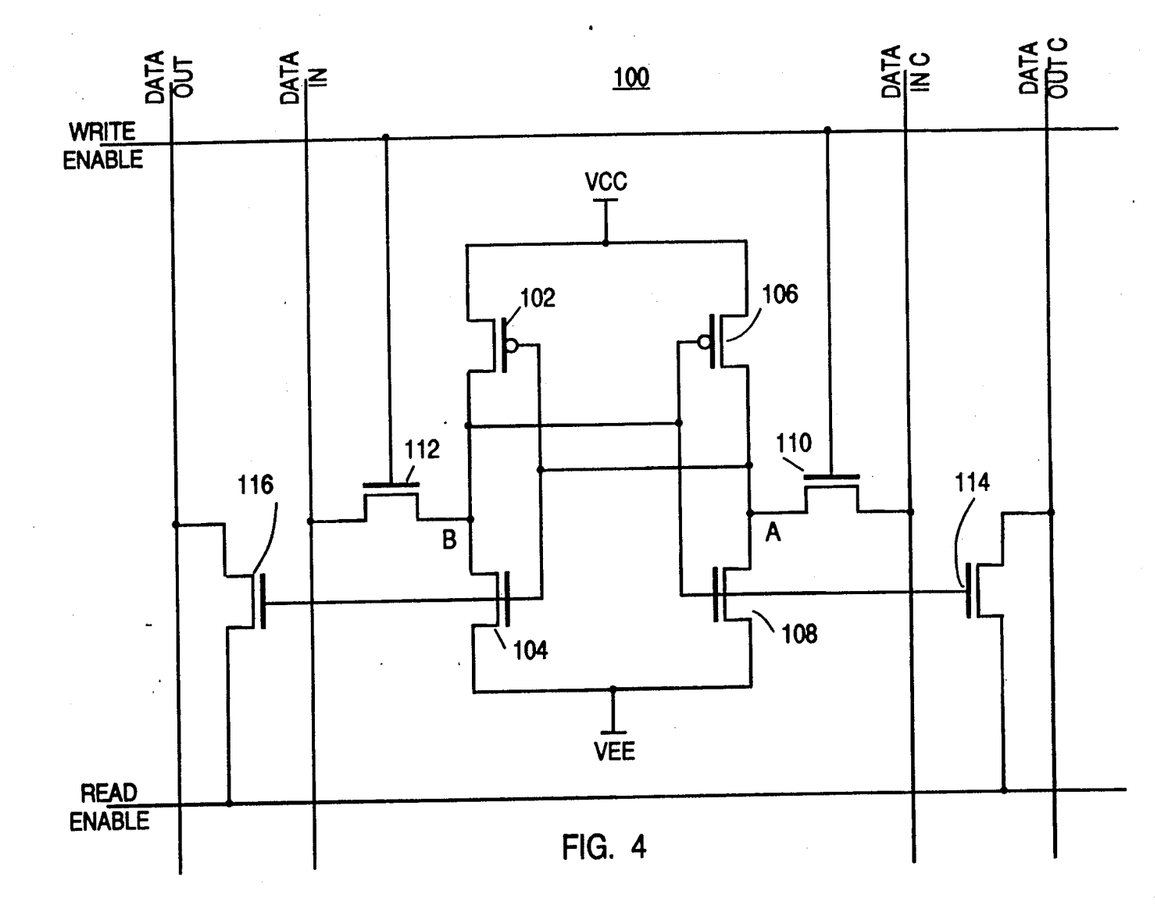
FIG. 4 is a schematic circuit diagram illustrating a memory cell according to the present invention.

FIG. 4 shows a memory cell 100 that includes a CMOS flip-flop storage cell, one or more read ports, and one or more write ports.

The CMOS flip-flop storage cell includes two pairs of complementary field-effect transistors 102, 104 and 106,108. Each pair includes a p-channel field-effect transistor having its drain connected to a positive voltage supply line $V_{CC}$ and its source connected to the drain of an n-channel field-effect transistor, which in turn has its source connected to a negative voltage supply line $V_{EE}$. The gates of each pair of field-effect transistors are connected together and are also connected to the drain-source connection of the other pair, thus forming complementary data storage nodes A and B.

In operation, in any given state of the flip-flop storage cell, the p-channel FET of one pair and the n-channel FET of the opposite pair will be conductive. The conductive p-channel FET forces one data storage node to $V_{CC}$, while the conductive n-channel FET forces the other data storage node to $V_{EE}$. Thus, each data storage node will have a voltage of either $V_{CC}$ or $V_{EE}$, depending on which transistors are conductive. Thus, as stated above, the flip-flop storage cell defines complementary states at nodes A and B.

The write port of the memory cell 100 utilizes two field-effect transistors 110 and 112 that are respectively connected between one of the data nodes A and B and one of two complementary DATA IN lines. N-channel transistor 110 has its drain and source connected between data storage node A and a DATA IN C line, respectively, while n-channel transistor 112 has its drain and source connected between data storage node B and a DATA IN line, respectively. Both transistors 110 and 112 have their gates connected to a WRITE ENABLE line.

A write operation occurs when the WRITE ENABLE line is pulled high, thus turning on transistors 110 and 112 and allowing the data contained on the complementary lines DATA IN and DATA IN C to pass through to the data storage nodes B and A, respectively.

In accordance with the present invention, the read port of memory cell 100 includes two field-effect transistors 114 and 116. Each FET 114, 116 is coupled between one of two complementary data-out lines DATA OUT and DATA OUT C and a READ ENABLE line to effectively isolate the read and write ports. The gates of the FET's 114 and 116 are connected to data nodes B and A, respectively.

A read operation is accomplished by pulling current out of the READ ENABLE line and monitoring the difference in current between the complementary data-out lines using a sense amplifier (not shown).

The read port transistors 114,116 are configured in a manner similar to the ECL differential read gates shown in the FIG. 1 memory cell 10. The inputs to this pseudo differential gate are the rail-to-rail states of the memory cell 100. The large delta voltage (approx. 5V) across the inputs of the differential gate permits very clean current steering.

The use of all CMOS transistors in the cell 100 not only permits a small layout area but also eliminates the need for level matching that results from the use of bipolar transistors.

Because a drain junction capacitance of an MOS device is inherently much smaller than a collector substrate capacitance of a bipolar device, the use of FETs 114,116 in the memory cell 100 results in a very low capacitance being placed on the DATA OUT lines compared to the prior art memory cells shown in FIGS. 1-3.

The sizing of the read port transistors 114, 116 is important for two reasons. First, the read transistors 114, 116 provide degeneration voltage to compensate for the ROW LINE voltage drop, thus reducing current hogging to acceptable levels. The smaller the device, the more degeneration voltage will appear across the device. Second, device size and the read current will set the ROW LINE swing; current value, device size and magnitude of the ROW LINE swing must work together to provide acceptable levels both for functionality and performance.

Read transistors 114, 116 do not present an isolation problem as long as their drain voltages, connected to the DATA OUT lines, are kept within a threshold voltage $V_T$ of the upper supply rail $V_{CC}$. This can be easily achieved using resistor loads or cascode type sense amplifiers.

Furthermore, even though CMOS transistors are used exclusively, an ECL read path with ECL levels is maintained through the entire read path.

Thus, the present invention provides a small memory cell with low parasitic capacitances and ECL level swings, resulting in high speed, low power and large bit count memories.

Figure 5:
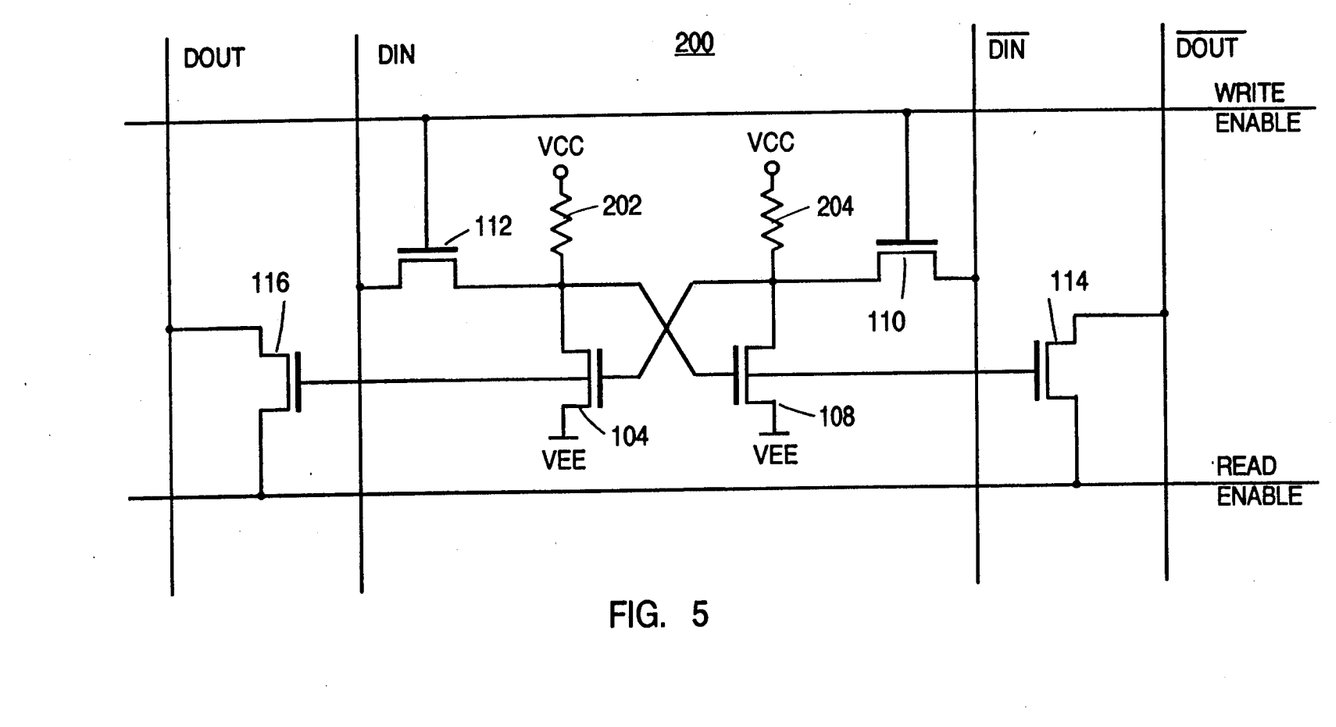
FIG. 5 is a schematic diagram illustrating an alternative embodiment of a memory cell in accordance with the present invention.

FIG. 5 shows an alternative embodiment of a memory cell in accordance with the present invention. The memory cell 200 shown in FIG. 5 is similar to the FIG. 4 memory cell 100, except that the p-channel transistors of the flip-flop storage cell are replaced by resistors 202 and 204 which provide stand-by current from the positive rail. Similar elements in FIGS. 4 and 5 are similarly identified.

While there are no operational differences between the FIG. 4 memory cell 100 and the FIG. 5 memory cell 200, some process technologies allow the resistors to lay out into a much smaller area than a PMOS device. However, the advantage gained in cell size by using resistors rather than PMOS transistors is at the cost of increased alpha sensitivity, more critical transistor sizing and the requirement of greater standby current.

It will be clear to those familiar with the art that, in either of the FIG. 4 or FIG. 5 embodiments of the invention described above, additional read or write ports can be provided by adding the appropriate data and control lines and the interconnecting FET transistors.

Figure 6:
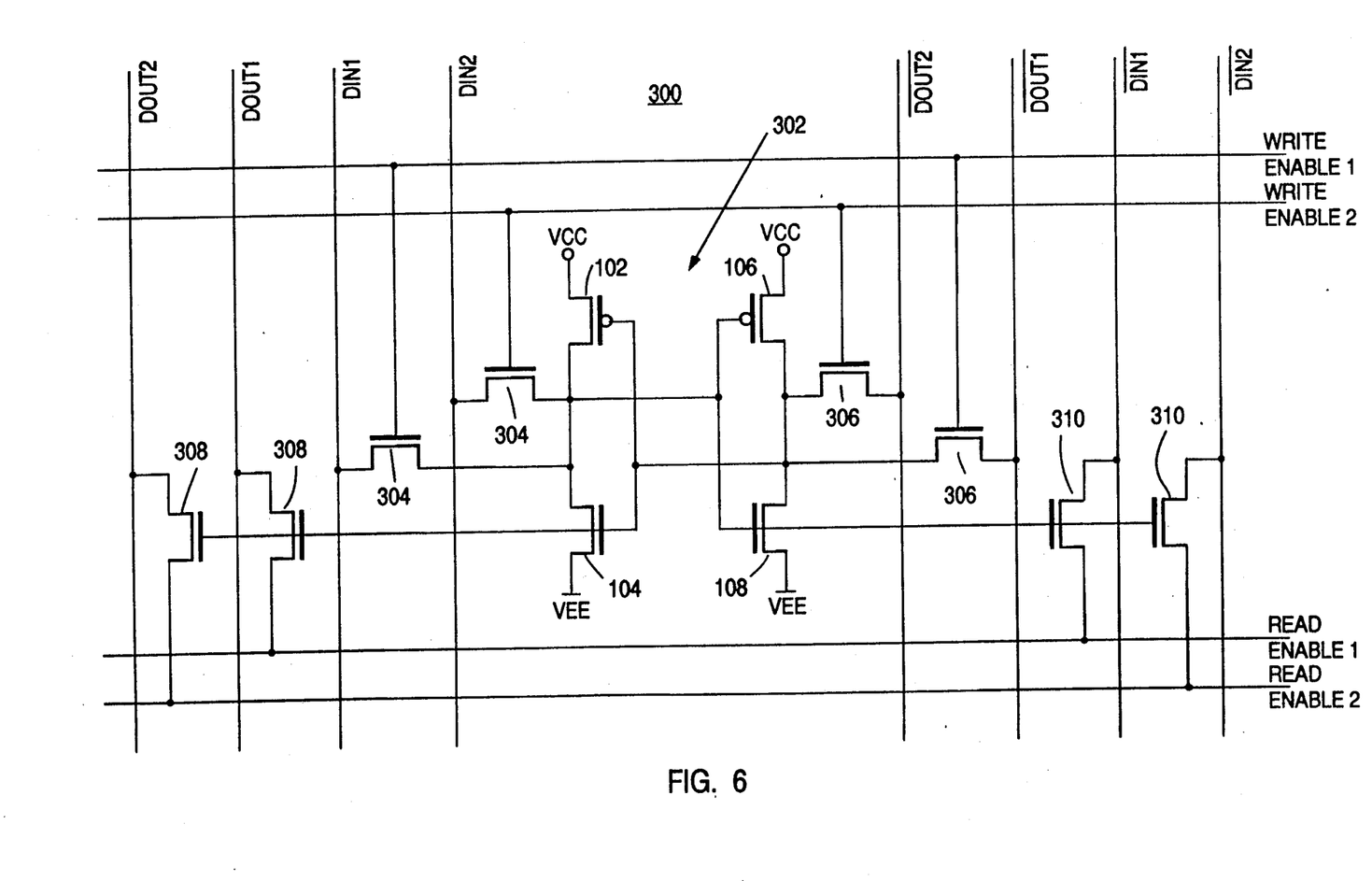
FIG. 6 is a schematic diagram illustrating a four-port memory cell according to the present invention.

FIG. 6 shows a four-port embodiment of a memory cell 300 in accordance with the present invention. The flip-flop storage cell 302 of memory cell 300 is identical to the memory cell 100 described above with respect to FIG. 4 and similar elements are similarly identified therein.

Each write port of memory cell 300 includes two FETs 304,306 respectively coupled between one of the data-in lines and a corresponding data storage node of the flip-flop storage cell 302. The gates of the write port transistors 304,306 are connected to a corresponding write-enable control line. Each read port includes two FETs 308,310 respectively coupled between one of the complementary data-out lines and a corresponding read enable line. Each of the gates of the read port transistors 308,310 is connected to one of the storage nodes of the flip-flop storage cell 302.

It should be noted that single port operation may be obtained with either the FIG. 4 memory cell 100 or the FIG. 5 memory cell 200 by simply providing the same address to both the WRITE ENABLE line and the READ ENABLE line.

It should be understood that various alternatives to the embodiments of the invention described herein may be employed in practicing the invention. It is intended that the following claims define the scope of the invention and that circuit structures within the scope of these claims and their equivalents be covered thereby.

What is claimed is:

1. A memory cell for use in a memory circuit, the memory cell comprising:
   (a) first and second complementary data-out lines;
   (b) a read enable control line;
   (c) a data storage cell connected between a positive supply voltage and a negative supply voltage and that defines first and second complementary data storage nodes;
   (d) write port means connected to the first and second data storage nodes for enabling data to be written to the data storage nodes; and
   (e) a read port that includes a first field-effect read port transistor having its source-drain path coupled between the first data-out line and the read enable control line, the gate of the first read port transistor connected to the second data storage node, and a second field-effect read port transistor having its source-drain path coupled between the second data-out line and the read enable control line, the gate of the second read port transistor connected to the first data storage node,
   whereby the storage cell is read by pulling current from the read enable line and monitoring the difference in current between the first and second complementary data-out lines.

2. A memory cell for use in a memory circuit, the memory cell comprising:
   (a) first and second complementary data-in lines;
   (b) first and second complementary data-out lines;
   (c) a write enable control line;
   (d) a read enable control line;
   (e) a data storage cell connected between a positive supply voltage and a negative supply voltage and that defines first and second complementary data storage nodes;
   (f) a write port that includes a first field-effect write port transistor having its source-drain path coupled between the first data-in line and the first storage node, the gate of the first write port transistor connected to the write enable line, and a second field effect write port transistor having its source-drain path coupled between the second data-in line and the second storage node, the gate of the second write port transistor connected to the write enable line; and
   (g) a read port that includes a first field-effect read port transistor having its source-drain path coupled between the first data-out line and the read enable control line, the gate of the first read port transistor connected to the second data storage node, and a second field-effect read port transistor having its source-drain path coupled between the second data-out line and the read enable control line, the gate of the second read port transistor connected to the first data storage node,
   whereby the storage cell is read by pulling current from the read enable line and monitoring the difference in current between the first and second complementary data-out lines.

3. A memory cell for use in a memory circuit, the memory cell comprising:
   (a) a write enable control line;
   (b) a read enable control line;
   (c) a data storage cell connected between a positive supply voltage and a negative supply voltage and that defines first and second complementary data storage nodes;

(d) a write port that includes a first field-effect write port transistor having its source-drain path coupled between a first data-in line and the first storage node, the gate of the first write port transistor connected to the write enable line, and a second field effect write port transistor having its source-drain path coupled between a second data-in line and the second storage node, the gate of the second write port transistor connected to the write enable line; and (e) a plurality of read ports, each read port including a first field-effect read port transistor having its source-drain path coupled between an individual first data-out line and the read enable control line, the gate of said first read port transistor connected to the second data storage node, and a second field-effect read port transistor having its source-drain path coupled between an individual second data-out line which is complementary to said first data-out line and the read enable control line, the gate of said second read port transistor connected to the first data storage node, whereby the storage cell is read via a selected one of the plurality of read ports by pulling current from the read enable line and monitoring the difference in current between the first and second complementary data-out lines of the selected read port.

4. A memory cell for use in a memory circuit, the memory cell comprising:

(a) positive and negative voltage supply lines;
(b) first and second complementary data-in lines;
(c) first and second complementary data-out lines;
(d) a CMOS flip-flop having two pairs of complementary field-effect transistors cross-coupled between the positive and negative voltage supply lines to form a data storage cell that defines first and second complementary data storage nodes;
(e) a write port that includes a first field-effect write port transistor having its source-drain path coupled between the first data-in line and the first data storage node, the gate of the first write port transistor connected to the write enable line, and a second filed-effect write port transistor having its source-drain path coupled between the second data-in line and the second data storage node, the gate of the second write port transistor connected to the write enable line; and
(f) a read port that includes a first-field effect read port transistor having its source-drain path coupled between the first data-out line and the read enable control line, the gate of the first read port transistor connected to the second data storage node, and a second field-effect read port transistor having its source-drain path coupled between the second data-out line and the read enable control line, the gate of the second read port transistor connected to the first data storage node.

5. A memory cell as defined in claim 4 wherein each of the first and second write port transistors and the first and second read port transistors is an n-channel transistor.

6. A memory cell as in claim 4 and further comprising one or more additional write ports, each additional write port including a first field-effect write port transistor having its source-drain path coupled between an individual first data-in line and the first storage node, the gate of said first write port transistor connected to the write enable control line, and a second write port transistor having its source-drain path coupled between an individual second data-in line complementary to said first individual data-in line and the second data storage node, the gate of said second write port transistor connected to the write enable control line.

7. A memory cell as in claim 4 and further comprising one or more additional read ports, each additional write port including a first field-effect read port transistor having its source-drain path coupled between an individual first data-out line and the read enable control line, the gate of said first read port transistor connected to the second data storage node, and a second field-effect read port transistor having its source-drain path coupled between an individual second data-out line complementary to said individual first data-out line and the read enable control line, the gate of said second read port transistor connected to the first data storage node.

8. A memory cell for use in a memory circuit, the memory cell comprising:

(a) positive and negative voltage supply lines;
(b) first and second complementary data-in lines;
(c) first and second complementary data-out lines;
(d) a read enable control line;
(e) a write enable control line;
(f) a data storage cell comprising a first resistor connected in series with a first n-channel field effect transistor between the positive and negative voltage supply lines, a second resistor connected in series with a second n-channel field-effect transistor between the positive and negative voltage supply lines, the gate of the first n-channel transistor connected to the interconnection between the second resistor and the second n-channel transistor, the gate of the second n-channel transistor connected to the interconnection between the first resister and the first n-channel transistor, thereby defining first and second complementary data storage nodes;
(g) a write port that includes a first n-channel write port transistor having its source-drain path coupled between the first data-in line and the first data storage node, the gate of the first write port transistor connected to the write enable line, and a second n-channel write port transistor having its source-drain path coupled between the second data-in line and the second data storage node, the gate of the second write port transistor connected to the write enable line; and
(f) a read port that includes a first n-channel read port transistor having its source-drain path coupled between the first data-out line and the read enable control line, the gate of the first read port transistor connected to the second data storage node, and a second n-channel read port transistor having its source-drain path coupled between the second data-out line and the read enable control line, the gate of the second read port transistor connected to the first data storage node.

whereby the storage cell is read by pulling current from the read enable line and monitoring the difference in current between the first and second complementary data-out lines.

* * * * *

UNITED STATES PATENT AND TRADEMARK OFFICE
CERTIFICATE OF CORRECTION

PATENT NO. : 5,189,640
DATED : February 23, 1993
INVENTOR(S) : Jeff M. Huard

It is certified that error appears in the above-identified patent and that said Letters Patent is hereby corrected as shown below:

In Col. 7, line 43, delete [filed-effect] and replace with field-effect.

In Col. 8, line 9, delete [write] and replace with read.

In Col. 8, line 52, delete [(f)] and replace with (h).

In Col. 8, line 61, delete [.] and replace with ,.

Signed and Sealed this

Thirtieth Day of November, 1993

Attest:

BRUCE LEHMAN

Attesting Officer

Commissioner of Patents and Trademarks